United States Patent
Namkung

(10) Patent No.: US 8,926,778 B2
(45) Date of Patent: Jan. 6, 2015

(54) MANUFACTURING APPARATUS AND METHOD OF ORGANIC LIGHT EMITTING DIODE DISPLAY

(71) Applicant: Jun Namkung, Yongin (KR)

(72) Inventor: Jun Namkung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 98 days.

(21) Appl. No.: 13/852,205

(22) Filed: Mar. 28, 2013

(65) Prior Publication Data

US 2014/0004767 A1    Jan. 2, 2014

(30) Foreign Application Priority Data

Jul. 2, 2012  (KR) .......................... 10-2012-0071878

(51) Int. Cl.

| | |
|---|---|
| B29C 65/76 | (2006.01) |
| B32B 37/10 | (2006.01) |
| B32B 38/10 | (2006.01) |
| B32B 43/00 | (2006.01) |
| H05B 33/10 | (2006.01) |
| H01L 51/56 | (2006.01) |
| H01L 21/67 | (2006.01) |

(52) U.S. Cl.
CPC ................. H05B 33/10 (2013.01); H01L 51/56 (2013.01); H01L 21/67092 (2013.01)
USPC ........... 156/247; 156/253; 156/286; 156/701; 156/497; 156/526; 156/755

(58) Field of Classification Search
CPC .............. H01L 21/67092; H01L 54/56; B29C 63/0004; B29C 66/80; B29C 66/82661; B32B 37/10; B32B 37/1018; B32B 38/0004; B32B 38/185; B32B 2309/68; B28D 5/0005; B28D 5/0023; B28D 5/0064; B28D 5/0082

USPC ......... 156/247, 250, 253, 285–287, 701, 497, 156/510, 750, 755
See application file for complete search history.

(56) References Cited

U.S. PATENT DOCUMENTS

| 4,078,962 A | * | 3/1978 | Krueger ...................... 156/497 |
| 4,347,844 A | | 9/1982 | Ohki et al. |

(Continued)

FOREIGN PATENT DOCUMENTS

| JP | 11-170793 | 6/1999 |
| JP | 2002-246728 | 8/2002 |

(Continued)

OTHER PUBLICATIONS

Machine Translation of KR 10-0820336 (Aug. 21, 2014).*

(Continued)

*Primary Examiner* — Sing P Chan
(74) *Attorney, Agent, or Firm* — Lee & Morse, P.C.

(57) ABSTRACT

A manufacturing apparatus for an organic light emitting diode (OLED) display includes a stage mounted with an organic light emitting display panel and a supporting substrate of the organic light emitting display panel, a porous sheet attachable to and detachable from a thin film encapsulation layer of the organic light emitting display panel, and a porous sheet attaching/detaching apparatus configured to be separable from the organic light emitting display panel and to attach and detach the porous sheet to and from the thin film encapsulation layer of the organic light emitting display panel. The porous sheet attaching/detaching apparatus is configured to remove an attaching/detaching gas from between the porous sheet and the thin film encapsulation layer to attach the porous sheet to the thin film encapsulation layer.

17 Claims, 6 Drawing Sheets

(56) References Cited

U.S. PATENT DOCUMENTS

| | | | |
|---|---|---|---|
| 4,666,551 A * | 5/1987 | Soberay et al. | 156/382 |
| 5,246,782 A * | 9/1993 | Kennedy et al. | 428/421 |
| 5,391,250 A * | 2/1995 | Cheney et al. | 156/268 |
| 5,409,777 A * | 4/1995 | Kennedy et al. | 428/411.1 |
| 5,730,922 A * | 3/1998 | Babb et al. | 264/258 |
| 6,082,140 A * | 7/2000 | Ackler et al. | 65/36 |
| 6,149,757 A * | 11/2000 | Chikaki et al. | 156/286 |
| 6,181,393 B1 * | 1/2001 | Enomoto et al. | 349/86 |
| 6,346,164 B1 * | 2/2002 | Nakamura et al. | 156/289 |
| 6,841,027 B2 * | 1/2005 | Muffler | 156/286 |
| 6,936,761 B2 * | 8/2005 | Pichler | 136/256 |
| 7,180,108 B2 * | 2/2007 | Kawase et al. | 257/288 |
| 7,301,274 B2 * | 11/2007 | Tanaka et al. | 313/504 |
| 7,303,643 B2 * | 12/2007 | Jeromin et al. | 156/286 |
| 7,361,927 B2 * | 4/2008 | Kawase et al. | 257/40 |
| 7,465,311 B2 * | 12/2008 | Wang et al. | 606/194 |
| 7,867,652 B2 * | 1/2011 | Welker et al. | 429/177 |
| 7,913,737 B2 * | 3/2011 | Takeuchi et al. | 156/556 |
| 7,943,000 B2 * | 5/2011 | Yoo et al. | 156/286 |
| 8,137,498 B2 * | 3/2012 | Sampica et al. | 156/286 |
| 8,137,594 B2 * | 3/2012 | Imanishi et al. | 252/519.5 |
| 8,206,547 B2 * | 6/2012 | Kawabe | 156/286 |
| 8,591,678 B2 * | 11/2013 | Suzuki | 156/64 |
| 8,617,343 B2 * | 12/2013 | Shinoda et al. | 156/295 |
| 8,679,888 B2 * | 3/2014 | Rogers et al. | 438/57 |
| 8,789,569 B2 * | 7/2014 | Noda et al. | 156/382 |
| 8,803,187 B2 * | 8/2014 | Carlson et al. | 257/99 |
| 8,808,477 B2 * | 8/2014 | Iwase | 156/87 |
| 2002/0062921 A1 * | 5/2002 | Muffler | 156/286 |
| 2003/0121604 A1 * | 7/2003 | Keil et al. | 156/286 |
| 2004/0187917 A1 * | 9/2004 | Pichler | 136/263 |
| 2004/0201348 A1 * | 10/2004 | Anandan | 313/512 |
| 2005/0077005 A1 * | 4/2005 | Chen et al. | 156/286 |
| 2005/0156520 A1 * | 7/2005 | Tanaka et al. | 313/512 |
| 2005/0227061 A1 * | 10/2005 | Slovak et al. | 428/323 |
| 2006/0054274 A1 * | 3/2006 | Tsai et al. | 156/285 |
| 2008/0032093 A1 * | 2/2008 | Deng et al. | 428/137 |
| 2008/0233062 A1 * | 9/2008 | Krishnan | 424/59 |
| 2009/0218034 A1 * | 9/2009 | Kawabe | 156/99 |
| 2010/0163155 A1 * | 7/2010 | Suzuki | 156/64 |
| 2010/0304123 A1 * | 12/2010 | Yoneyama et al. | 428/317.9 |
| 2011/0146901 A1 * | 6/2011 | Hermanowski | 156/249 |
| 2011/0155317 A1 * | 6/2011 | Shinoda et al. | 156/275.5 |
| 2011/0277813 A1 * | 11/2011 | Rogers et al. | 136/244 |
| 2011/0297645 A1 * | 12/2011 | Miyata | 216/23 |
| 2011/0300657 A1 * | 12/2011 | Chesterfield et al. | 438/46 |
| 2012/0111392 A1 * | 5/2012 | Takanashi et al. | 136/251 |
| 2012/0219782 A1 * | 8/2012 | Lee et al. | 428/220 |
| 2012/0223635 A1 * | 9/2012 | Mochizuki et al. | 313/512 |
| 2012/0226046 A1 * | 9/2012 | Zheng et al. | 546/256 |
| 2012/0235171 A1 * | 9/2012 | Kim et al. | 257/88 |
| 2012/0248618 A1 * | 10/2012 | Akino | 257/773 |
| 2013/0309745 A1 * | 11/2013 | Lee et al. | 435/175 |
| 2013/0323468 A1 * | 12/2013 | Myers et al. | 428/143 |
| 2014/0004767 A1 * | 1/2014 | Namkung | 445/16 |
| 2014/0110679 A1 * | 4/2014 | Carlson et al. | 257/40 |
| 2014/0193971 A1 * | 7/2014 | Akino | 438/612 |
| 2014/0216524 A1 * | 8/2014 | Rogers et al. | 136/249 |

FOREIGN PATENT DOCUMENTS

| | | |
|---|---|---|
| JP | 2008-030174 A | 2/2008 |
| JP | 2010-145597 A | 7/2010 |
| KR | 10-2001-0067388 A | 7/2001 |
| KR | 10-2006-0101956 A | 9/2006 |
| KR | 10-0820336 B1 | 4/2008 |
| KR | 10-2012-0021437 A | 3/2012 |

OTHER PUBLICATIONS

Machine Translation of KR 10-2006-0101956 (Aug. 21, 2014).*

* cited by examiner

MANUFACTURING APPARATUS AND METHOD OF ORGANIC LIGHT EMITTING DIODE DISPLAY

CROSS-REFERENCE TO RELATED APPLICATION

This application claims priority under 35 U.S.C. §119 to Korean Patent Application No. 10-2012-0071878 filed in the Korean Intellectual Property Office on Jul. 2, 2012, the entire contents of which are incorporated herein by reference.

BACKGROUND

1. Field

Embodiments relate generally to an apparatus for manufacturing an organic light emitting diode (OLED) display and a method thereof.

2. Description of the Related Art

An organic light emitting diode (OLED) display includes a plurality of OLEDs formed of a hole injection electrode, an organic emission layer, and an electron injection electrode. Each OLED emits light by energy generated when excitons that are generated as electrons and holes are combined drop from an excited state to a ground state. The OLED display displays an image by using the light.

The OLED display has a self-luminance characteristic, and unlike a liquid crystal display (LCD), the thickness and weight thereof can be reduced since a separate light source is not required. Further, because the OLED display has high quality characteristics such as low power consumption, high luminance, and high reaction speed, the OLED display is appropriate for use in a mobile electronic device.

SUMMARY

Embodiments are directed to a manufacturing apparatus for an organic light emitting diode (OLED) display that includes a stage mounted with an organic light emitting display panel and a supporting substrate of the organic light emitting display panel, a porous sheet attachable to and detachable from a thin film encapsulation layer of the organic light emitting display panel, and a porous sheet attaching/detaching apparatus configured to be separable from the organic light emitting display panel and to attach and detach the porous sheet to and from the thin film encapsulation layer of the organic light emitting display panel. The porous sheet attaching/detaching apparatus is configured to remove an attaching/detaching gas from between the porous sheet and the thin film encapsulation layer to attach the porous sheet to the thin film encapsulation layer.

The porous sheet attaching/detaching apparatus may be configured to inject the attaching/detaching gas between the porous sheet and the thin film encapsulation layer to remove the porous sheet from the thin film encapsulation layer.

The porous sheet attaching/detaching apparatus may be positioned over the organic light emitting display panel.

The porous sheet attaching/detaching apparatus may be positioned under the organic light emitting display panel.

The supporting substrate may include an alignment mark for aligning the porous sheet and the organic light emitting display panel.

The porous sheet may have a thickness in a range of about 1 μm to 200 μm. The porous sheet may have a porosity in a range of about 10% to about 45%. The porous sheet may include fine holes having a diameter in a range of about 1 Å to about 10 μm. The porous sheet may be made of one of plastic based material, silica based material, and carbon based material.

The attaching/detaching gas may be one of air, nitrogen gas, and helium gas.

Embodiments are also directed to a method of manufacturing an organic light emitting diode (OLED) display, the method including mounting an organic light emitting display panel and a supporting substrate of the organic light emitting display panel on a stage, attaching a porous sheet to a porous sheet attaching/detaching apparatus, the porous sheet attaching/detaching apparatus being positioned to be spaced apart from the organic light emitting display panel, and removing an attaching/detaching gas from between the porous sheet and the thin film encapsulation layer of the organic light emitting display panel by using the porous sheet attaching/detaching apparatus to attach the porous sheet to the thin film encapsulation layer.

The method may further include removing the organic light emitting display panel from the supporting substrate, cutting the organic light emitting display panel to divide the organic light emitting display panel into a plurality of organic light emitting display cells, each of the organic light emitting display cells including a corresponding portion of the thin film encapsulation layer and porous sheet, detaching a corresponding portion of the porous sheet from the corresponding portion of the thin film encapsulation layer of each of the organic light emitting display cells, and attaching a polarizing plate on the corresponding portion of the thin film encapsulation layer of each of the organic light emitting display cells.

The method may further include removing the organic light emitting display panel from the supporting substrate, removing the porous sheet from the thin film encapsulation layer of the organic light emitting display panel, cutting the organic light emitting display panel to divide the organic light emitting display into a plurality of organic light emitting display cells, each of the organic light emitting display cells including a corresponding portion of the thin film encapsulation layer, and attaching a polarizing plate on the corresponding portion of the thin film encapsulation layer of each of the organic light emitting display cells.

An attaching/detaching gas may be injected between the porous sheet and the thin film encapsulation layer to remove the porous sheet from the thin film encapsulation layer.

The porous sheet attaching/detaching apparatus may be positioned over the organic light emitting display panel.

The porous sheet attaching/detaching apparatus may be positioned under the organic light emitting display panel.

The porous sheet and the organic light emitting display panel may be aligned by using an alignment mark formed in the supporting substrate.

BRIEF DESCRIPTION OF THE DRAWINGS

Features will become apparent to those of ordinary skill in the art by describing in detail exemplary embodiments with reference to the attached drawings in which:

FIG. 2 is a view of a porous sheet including fine holes in a cubic arrangement, and FIG. 3 is a view of a porous sheet including fine holes in a rhombohedron arrangement.

DETAILED DESCRIPTION

Figure 1:
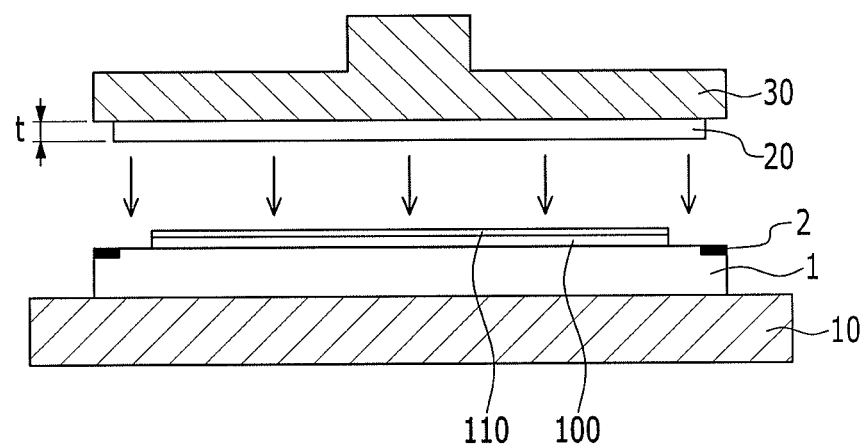
FIG. 1 is a schematic diagram of a manufacturing apparatus of an organic light emitting diode (OLED) display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Figure 2:
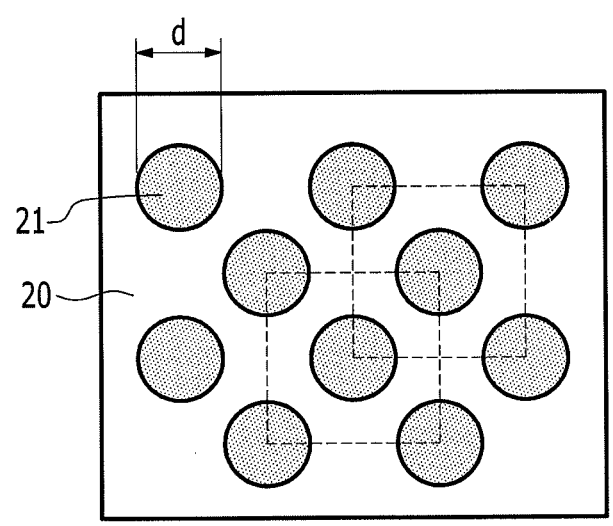
FIG. 2 and FIG. 3 are partially enlarged views of a porous sheet of a manufacturing apparatus for an organic light emitting diode (OLED) display according to the exemplary embodiment.
Figure 3:
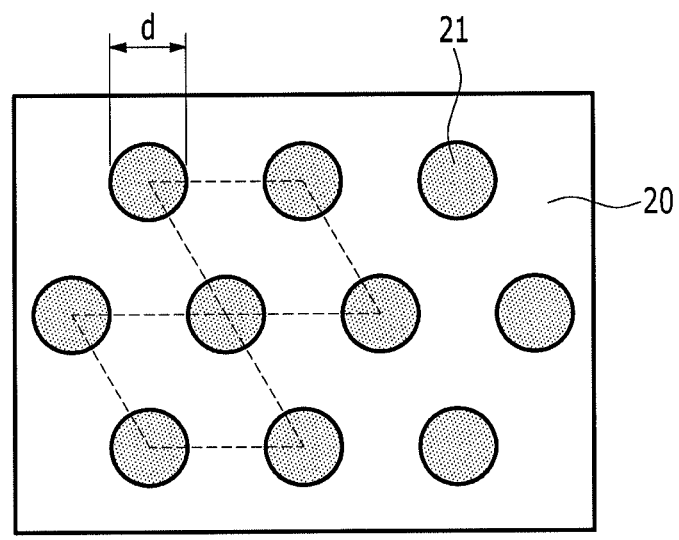

FIG. 1 is a schematic diagram of a manufacturing apparatus of an organic light emitting diode (OLED) display according to an exemplary embodiment, and FIG. 2 and FIG. 3 are partially enlarged views of a porous sheet of a manufacturing apparatus for an organic light emitting diode (OLED) display according to the exemplary embodiment, wherein FIG. 2 is a view of a porous sheet including fine holes of a cubic arrangement, and FIG. 3 is a view of a porous sheet including fine holes of a rhombohedron arrangement.

As shown in FIG. 1, a manufacturing apparatus of an organic light emitting diode (OLED) display according to the present exemplary embodiment includes a stage 10 mounting a supporting substrate 1 supporting an organic light emitting display panel 100, a porous sheet 20 that can be attached to or detached from a thin film encapsulation layer 110 of the organic light emitting display panel 100, and a porous sheet attaching/detaching apparatus 30 separable from the organic light emitting display panel 100 to attach or detach the porous sheet 20 to or from the thin film encapsulation layer 110 of the organic light emitting display panel 100.

The supporting substrate 1 mounted on the stage 10 includes a polymer film to be adhered to the organic light emitting display panel 100 to support the flexible organic light emitting display panel 100 in the manufacturing process.

The supporting substrate 1 includes an alignment mark 2 to align the porous sheet 20 and the organic light emitting display panel 100 to each other for adhering the porous sheet 20 attached to the porous sheet attaching/detaching apparatus 30 to the organic light emitting display panel 100.

The porous sheet 20 may be one selected from a plastic based material such as polyethylene terephthalate (PET) or polybutylene terephthalate (PBT), a silica based material, and a carbon based material. The plastic porous sheet 20 may have excellent flexibility thereby being easily attached to an inorganic and metallic thin film encapsulation layer 110.

A thickness (t) of the porous sheet 20 may be in a range of 1 μm to 200 μm. Manufacturing the porous sheet 20 having the thickness (t) of less than 1 μm may be difficult. Even if the porous sheet 20 having the thickness (t) of less than 1 μm is manufactured, handling for process application may be difficult, and the porous sheet 20 may be easily damaged.

When the thickness of the porous sheet 20 is greater than 200 μm, the flexibility of the porous sheet 20 may be decreased such that a height step of the surface of the thin film encapsulation layer may not be compensated. Resultantly a bubble may be generated in a portion where the height step is generated between the thin film encapsulation layer 110 and the porous sheet 20.

A diameter (d) of fine holes 21 of the porous sheet 20 may be in a range of about 1 Å to about 10 μm. When the diameter (d) of the fine holes 21 of the porous sheet 20 is less than about 1 Å, a flow of air may not be smooth such that absorption and removal of the porous sheet 20 may not be easy. When the diameter (d) of the fine holes 21 of the porous sheet 20 is more than about 10 μm, the surface of the thin film encapsulation layer 110 may be convexly protruded by the absorption of the fine holes 21 of the porous sheet 20.

Porosity of the porous sheet 20 may be in a range of 10% to 45%. When the porosity of the porous sheet 20 is less than 10%, the flow of air may not be smooth such that the absorption and removal of the porous sheet 20 may not be easy, When the porosity of the porous sheet 20 is more than 45%, a vacuum may not be maintained and may be broken between the porous sheet 20 and the thin film encapsulation layer 110 such that the porous sheet 20 may become detached from the thin film encapsulation layer 110.

As shown in FIG. 2, the fine holes 21 of the porous sheet may have a cubic arrangement, or as shown in FIG. 3, the fine holes 21 of the porous sheet have a rhombohedral arrangement. Thus, the fine holes 21 may be arranged with a predetermined pattern. Also, the fine holes 21 of the porous sheet 20 may be randomly arranged with the cubic arrangement and the rhombohedral arrangement.

The porous sheet attaching/detaching apparatus 30 is positioned on the organic light emitting display panel 100. The porous sheet attaching/detaching apparatus 30 removes a attaching/detaching gas 3 (see FIG. 5) from between the porous sheet 20 and the thin film encapsulation layer 110 to attach the porous sheet 20 to the thin film encapsulation layer 110, or injects the attaching/detaching gas 3 between the porous sheet 20 and the thin film encapsulation layer 110 to detach the porous sheet 20 from the thin film encapsulation layer 110. The attaching/detaching gas 3 may be one selected from air, nitrogen gas, and helium gas.

As described below, the porous sheet 20 is attached to or detached from the organic light emitting display panel 100 by using the attaching/detaching gas 3 without using an adhesive.

A manufacturing method of a manufacturing apparatus of an organic light emitting diode (OLED) display according to the exemplary embodiment will be described with reference to FIG. 1 and FIG. 4 to FIG. 9.

FIG. 4 to FIG. 9 are views showing stages of a manufacturing method using a manufacturing apparatus of an organic light emitting diode (OLED) display according to the exemplary embodiment.

As shown in FIG. 1, the organic light emitting display panel 100 attached to the supporting substrate 1 is mounted on the stage 10. Also, the porous sheet 20 is attached to the porous sheet attaching/detaching apparatus 30 positioned to be separated from the organic light emitting display panel 100.

Figure 4:
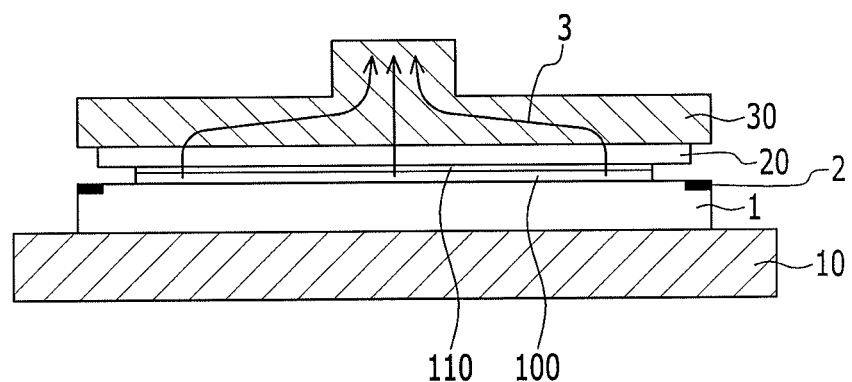
FIG. 4 to FIG. 9 are views showing stages of a manufacturing method of an organic light emitting diode (OLED) display according to the exemplary embodiment.

As shown in FIG. 4, the attaching/detaching gas 3 is removed from between the porous sheet 20 and the thin film encapsulation layer 110 of the organic light emitting display panel 100 by using the porous sheet attaching/detaching apparatus 30, thereby increasing an absorption pressure such that the porous sheet 20 is attached to the thin film encapsulation layer 110. Accordingly, a vacuum state is maintained between the porous sheet 20 and the thin film encapsulation layer 110 of the organic light emitting display panel 100.

After aligning the porous sheet 20 and the organic light emitting display panel 100 by using the alignment mark 2, the porous sheet 20 is attached to the organic light emitting display panel 100. Accordingly, the thin film encapsulation layer 110 is protected by the porous sheet 20 in following processes.

Figure 5:
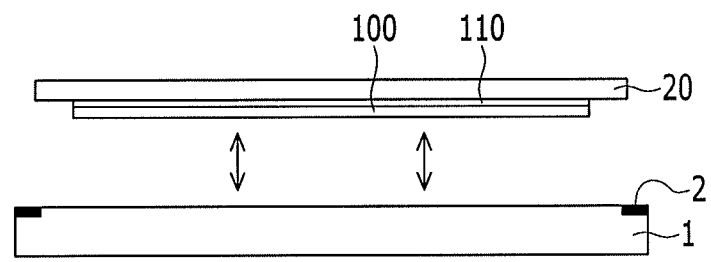

As shown in FIG. 5, the organic light emitting display panel 100 is detached from the supporting substrate 1. A lower protection film may be attached under the organic light emitting display panel 100 to protect a lower surface of the organic light emitting display panel 100.

Figure 6:
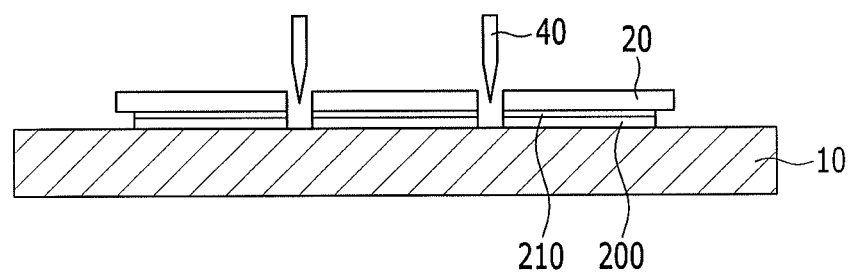

As shown in FIG. 6, the organic light emitting display panel 100 mounted on the stage 10 is cut by a cutter 40 to divide the organic light emitting display panel 100 into a plurality of organic light emitting display cells 200. The porous sheet 20 is divided into multiple cells. At this time, the porous sheet 20 is attached to the organic light emitting display panel 100 in the vacuum state such that a defect is not generated on the surface of the organic light emitting display cells 200 by the cutting.

Figure 7:
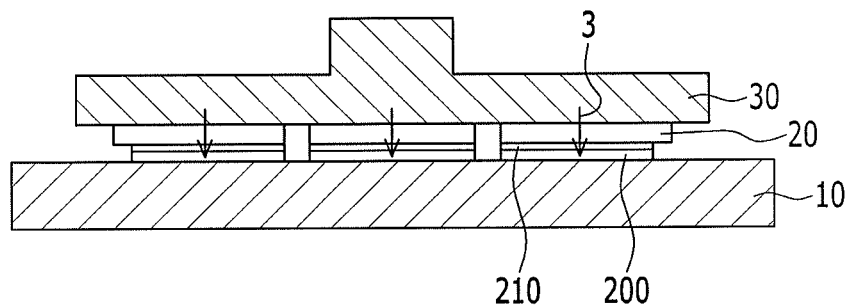
Figure 8:
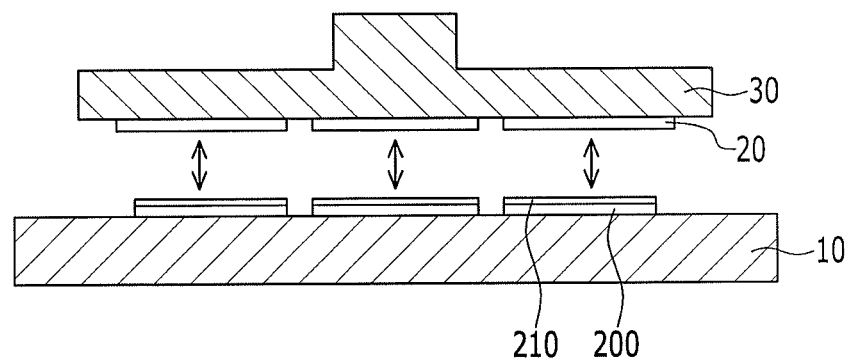

As shown in FIG. 7 and FIG. 8, the porous sheet 20 is removed from the thin film encapsulation layer 210 of the organic light emitting display cells 200. The attaching/detaching gas 3 is injected between the porous sheet 20 and the thin film encapsulation layer 210 such that the porous sheet 20 is removed from the thin film encapsulation layer 210. As described above, the attaching/detaching gas 3 is injected to remove the porous sheet 20 from the thin film encapsulation layer 210 such that the surface of the thin film encapsulation layer 210 is not damaged.

Figure 9:
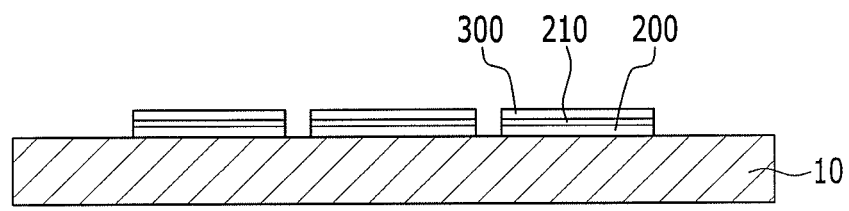

As shown in FIG. 9, a polarizing plate 300 is attached to a thin film encapsulation layer 210 of the organic light emitting display cell 200, thereby completing the organic light emitting diode (OLED) display.

In the manufacturing method of the organic light emitting diode (OLED) display according to the exemplary embodiment shown in FIG. 4 to FIG. 9, after the organic light emitting display panel 100 is cut to be divided into a plurality of organic light emitting display cells 200, the porous sheet 20 may be removed from the thin film encapsulation layer 210 of the organic light emitting display cell 200. However, in other implementations, a manufacturing method of the organic light emitting diode (OLED) display may be provided in which the organic light emitting display panel 100 is cut to be divided into a plurality of organic light emitting display cells 200 after the porous sheet 20 is removed from the thin film encapsulation layer 110 of the organic light emitting display panel 100.

Another manufacturing method of a manufacturing apparatus of an organic light emitting diode (OLED) display according to the exemplary embodiment will be described with reference to FIG. 1, FIG. 4, FIG. 5, FIG. 10, and FIG. 11.

Figure 10:
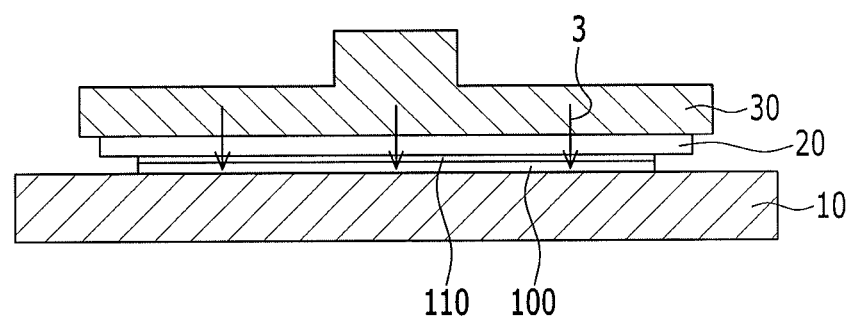
FIG. 10 and FIG. 11 are views showing stages of another manufacturing method of an organic light emitting diode (OLED) display according to the exemplary embodiment.
Figure 11:
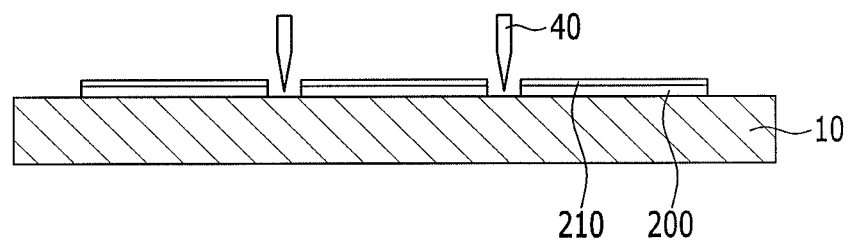

FIG. 10 and FIG. 11 are views sequentially showing another manufacturing method using a manufacturing apparatus of an organic light emitting diode (OLED) display according to the exemplary embodiment. The method is substantially equivalent to the method shown in FIG. 1 and FIG. 4 to FIG. 9, except for the cutting sequence of the organic light emitting display panel 100. Accordingly a description of similar features will not be repeated. In particular, the processing steps shown in FIG. 1 and FIG. 4 and FIG. 5 may be the same. As shown in FIG. 1, the organic light emitting display panel 100 attached to the supporting substrate 1 is mounted on the stage 10. Also, the porous sheet 20 is attached to the porous sheet attaching/detaching apparatus 30 positioned to be separated from the organic light emitting display panel 100.

As shown in FIG. 4, the attaching/detaching gas 3 is removed from between the porous sheet 20 and the thin film encapsulation layer 110 of the organic light emitting display panel 100 by using the porous sheet attaching/detaching apparatus 30, thereby increasing an absorption pressure such that the porous sheet 20 is attached to the thin film encapsulation layer 110.

As shown in FIG. 5, the organic light emitting display panel 100 is detached from the supporting substrate 1.

As shown in FIG. 10, the porous sheet 20 is removed from the thin film encapsulation layer 110 of the organic light emitting display panel 100 mounted on the stage 10. The attaching/detaching gas 3 is injected between the porous sheet 20 and the thin film encapsulation layer 110 to remove the porous sheet 20 from the thin film encapsulation layer 110. The attaching/detaching gas 3 is injected to detach the porous sheet 20 from the thin film encapsulation layer 110, and thereby the surface of the thin film encapsulation layer 110 is not damaged.

As shown in FIG. 11, the organic light emitting display panel 100 mounted on the stage 10 is cut by using the cutter 40 to be divided into a plurality of organic light emitting display cells 200.

In the exemplary embodiment, the porous sheet attaching/detaching apparatus 30 is positioned on the organic light emitting display panel 100. In another embodiment, the porous sheet attaching/detaching apparatus 30 may be positioned under the organic light emitting display panel 100.

The manufacturing apparatus of the organic light emitting diode (OLED) display according to another exemplary embodiment will be described with reference to FIG. 12.

Figure 12:
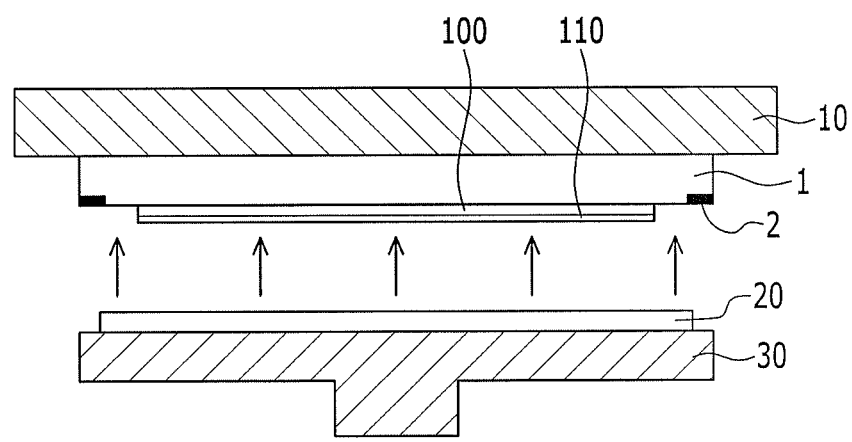
FIG. 12 is a schematic diagram of a manufacturing apparatus of an organic light emitting diode (OLED) display according to another exemplary embodiment.

FIG. 12 is a schematic diagram of a manufacturing apparatus of an organic light emitting diode (OLED) display according to another exemplary embodiment.

This exemplary embodiment is substantially equivalent to the exemplary embodiment shown in FIG. 1 except for a position of the porous sheet attaching/detaching apparatus.

As shown in FIG. 12, the porous sheet attaching/detaching apparatus 30 of the manufacturing apparatus of the organic light emitting diode (OLED) display according to this exemplary embodiment is positioned under the organic light emitting display panel 100. Also, the supporting substrate 1 and the organic light emitting display panel 100 are mounted under the stage 10.

As described above, the porous sheet attaching/detaching apparatus 30 is positioned under the organic light emitting display panel 100, and thereby dust or fine particles may not be attached to the organic light emitting display panel 100 during the attaching process of the porous sheet 20.

By way of summation and review, an OLED may deteriorate due to internal and external factors. With the internal factors, the organic emissive layer may deteriorate under an atmosphere of oxygen due, for example, to indium tin oxide (ITO) being an electrode material, or due to an interfacial reaction between organic layer components of the organic emissive layer. The external factors include external moisture and oxygen, and ultraviolet rays. In particular, external oxygen and moisture seriously influence the lifespan of the OLED. Accordingly, it is desirable to package the OLED such that it is sealed from the outside in a vacuum tight manner.

A thin film encapsulation (TFE) technique may be introduced in packaging the organic light emitting diode. With the thin film encapsulation technique, one or more of inorganic and organic layers are alternately stacked on the OLEDS formed in the display area of the substrate, thereby covering the display area with a TFE layer. With an OLED display with such a TFE layer, if the substrate is formed with a flexible film, it can be bent easily. Accordingly, the TFE layer is advantageous in forming a slim structure.

To prevent the thin film encapsulation layer from being damaged in follow-up processes, a temporary upper protection film may be attached on the thin film encapsulation layer. This temporary upper protection film may include PET (polyethylene terephthalate), a silicon-based adhesive attached thereunder, and a liner covering the adhesive to maintain adhesive force of the adhesive.

When the temporary upper protection film is separated from the thin film encapsulation layer, the thin film encapsulation layer may be damaged due to the adhesive power of the adhesive. If the adhesive power of the adhesive is more than 20 gf/inch, the adhesive power is very strong such that the surface of the thin film encapsulation layer may be pulled away when separating the temporary upper protection film. Further, if the adhesive power of the adhesive is less than 3 gf/inch, the surfaces of the temporary upper protection film and the thin film encapsulation layer may not be properly attached to each other and the temporary upper protection film may become detached in following processes.

The adhesive power of the adhesive of the temporary upper protection film may increase according to time such that the thin film encapsulation layer may be lifted when removing the temporary upper protection film. Commercial temporary upper protection films may vary greatly in adhesive power between companies producing the temporary upper protection film, or between products. Accordingly, it may be difficult to prevent damage to the thin film encapsulation layer using such a temporary upper protection film. Moreover, the adhesive of the conventional temporarily upper protection film interrupts the cutting of the organic light emitting display panel such that the defect may be generated on the surface of the organic light emitting display cells.

Also, in applying the temporary upper protection film, while a roller applying pressure contacts the temporary upper protection film and is rolled at a predetermined speed, the liner may be removed from the temporary upper protection film, and simultaneously, the exposed adhesive may become adhered to the thin film encapsulation layer to attach the temporary upper protection film to the thin film encapsulation layer. In this case, when pressing and rolling the roller, air may remain between the thin film encapsulation layer and the temporary upper protection film by a step generated in the surface of the thin film encapsulation layer, so a portion of the temporary upper protection film may be wrinkled.

In contrast, embodiments provide an apparatus for manufacturing an organic light emitting diode (OLED) display for preventing a surface defect of an organic light emitting display panel generated in an attaching and separating process of a temporary upper protection film to protect a thin film encapsulation layer, and a method thereof. In the manufacturing apparatus and the manufacturing method, an attaching/detaching gas is used to attach or detach a porous sheet to or from the organic light emitting display panel. A process of attaching and detaching a temporary upper protection film by an adhesive is omitted. Accordingly, the manufacturing process may be simplified, and surface defect of the organic light emitting display panel due to the adhesive may be prevented in the attaching/detaching process. In other words, the process of attaching and removing a temporary upper protection film using an adhesive may be omitted.

Moreover, an air trap defect or partial crease that could be generated if a rolling process were used may be prevented.

Further, the surface of the thin film encapsulation layer is not damaged in the processes according to embodiments, and the organic light emitting display panel may be solidly protected before attaching a polarizing plate.

While this disclosure has been described in connection with what is presently considered to be practical exemplary embodiments, it is to be understood to not be limited to the disclosed embodiments, but, on the contrary, is intended to cover various modifications and equivalent arrangements included within the spirit and scope of the appended claims.

What is claimed is:

1. A manufacturing apparatus for an organic light emitting diode (OLED) display, the manufacturing apparatus comprising:
 a stage mounted with an organic light emitting display panel and a supporting substrate of the organic light emitting display panel;
 a porous sheet attachable to and detachable from a thin film encapsulation layer of the organic light emitting display panel;
 a porous sheet attaching/detaching apparatus configured to be separable from the organic light emitting display panel and to attach and detach the porous sheet to and from the thin film encapsulation layer of the organic light emitting display panel; and
 wherein the porous sheet attaching/detaching apparatus is configured to remove an attaching/detaching gas from between the porous sheet and the thin film encapsulation layer to attach the porous sheet to the thin film encapsulation layer.

2. The manufacturing apparatus of claim 1, wherein the porous sheet attaching/detaching apparatus is configured to inject the attaching/detaching gas between the porous sheet and the thin film encapsulation layer to remove the porous sheet from the thin film encapsulation layer.

3. The manufacturing apparatus of claim 1, wherein the porous sheet attaching/detaching apparatus is positioned over the organic light emitting display panel.

4. The manufacturing apparatus of claim 1, wherein the porous sheet attaching/detaching apparatus is positioned under the organic light emitting display panel.

5. The manufacturing apparatus of claim 1, wherein the supporting substrate includes an alignment mark for aligning the porous sheet and the organic light emitting display panel.

6. The manufacturing apparatus of claim 1, wherein the porous sheet has a thickness in a range of about 1 µm to about 200 µm.

7. The manufacturing apparatus of claim 6, wherein the porous sheet has a porosity in a range of about 10% to about 45%.

8. The manufacturing apparatus of claim 7, wherein the porous sheet includes fine holes having a diameter in a range of about 1 Å to about 10 µm.

9. The manufacturing apparatus of claim 8, wherein the porous sheet is made of one of plastic based material, silica based material, and carbon based material.

10. The manufacturing apparatus of claim 1, wherein the attaching/detaching gas is one of air, nitrogen gas, and helium gas.

11. A method of manufacturing an organic light emitting diode (OLED) display, the method comprising;
 mounting an organic light emitting display panel and a supporting substrate of the organic light emitting display panel on a stage;
 attaching a porous sheet to a porous sheet attaching/detaching apparatus, the porous sheet attaching/detaching apparatus being positioned to be spaced apart from the organic light emitting display panel; and removing an attaching/detaching gas from between the porous sheet and a thin film encapsulation layer of the organic light emitting display panel by using the porous sheet attaching/detaching apparatus to attach the porous sheet to the thin film encapsulation layer.

12. The method of claim 11, further comprising:
removing the organic light emitting display panel from the supporting substrate;
cutting the organic light emitting display panel to divide the organic light emitting display panel into a plurality of organic light emitting display cells, each of the organic light emitting display cells including a corresponding portion of the thin film encapsulation layer and porous sheet;
detaching corresponding portion of the porous sheet from the corresponding portion of the thin film encapsulation layer of each of the organic light emitting display cells; and
attaching a polarizing plate on the corresponding portion of the thin film encapsulation layer of each of the organic light emitting display cells.

13. The method of claim 12, wherein an attaching/detaching gas is injected between the porous sheet and the thin film encapsulation layer to remove the porous sheet from the thin film encapsulation layer.

14. The method of claim 13, wherein the porous sheet attaching/detaching apparatus is positioned over the organic light emitting display panel.

15. The method of claim 13, wherein the porous sheet attaching/detaching apparatus is positioned under the organic light emitting display panel.

16. The method of claim 11, further comprising:
removing the organic light emitting display panel from the supporting substrate;
removing the porous sheet from the thin film encapsulation layer of the organic light emitting display panel;
cutting the organic light emitting display panel to divide the organic light emitting display into a plurality of organic light emitting display cells, each of the organic light emitting display cells including a corresponding portion of the thin film encapsulation layer; and
attaching a polarizing plate on the corresponding portion of the thin film encapsulation layer of each of the organic light emitting display cells.

17. The method of claim 11, wherein the porous sheet and the organic light emitting display panel are aligned by using an alignment mark formed in the supporting substrate.

* * * * *